METHOD FOR THE FABRICATION OF INTEGRATED CIRCUITS

Filed Dec. 28, 1965

INVENTORS
THOMAS H. RAMSEY, JR.
JAMES H. VAN TASSEL
RICHARD P. ABRAHAM
BY William E. Johnson, Jr.
ATTORNEY INVENTORS
THOMAS H. RAMSEY, JR.
JAMES H. VAN TASSEL
RICHARD P. ABRAHAM
BY William E. Johnson, Jr.
ATTORNEY INVENTORS
THOMAS H. RAMSEY, JR.
JAMES H. VAN TASSEL
RICHARD P. ABRAHAM
BY William E. Johnson, Jr.
ATTORNEY INVENTORS
THOMAS H. RAMSEY, JR.
JAMES H. VAN TASSEL
RICHARD P. ABRAHAM
BY William E. Johnson, Jr.
ATTORNEY United States Patent Office 3,453,722
Patented July 8, 1969

3,453,722
METHOD FOR THE FABRICATION OF INTEGRATED CIRCUITS

Thomas H. Ramsey, Jr., Garland, James H. Van Tassel, Richardson, and Richard P. Abraham, Dallas, Tex., assignors to Texas Instruments Incorporated, Dallas, Tex., a corporation of Delaware Filed Dec. 28, 1965, Ser. No. 516,952
Int. Cl. H01l 1/16
U.S. Cl. 29—577 7 Claims

ABSTRACT OF THE DISCLOSURE

Method of fabricating integrated circuit devices comprising providing openings in the underside of a semiconductor wafer to isolate the components on the upper side of said wafer from each other, applying a mask to said underside to cover the areas between said integrated circuits, exposing said openings, filling said exposed openings with dielectric and separating the wafer at the areas covered by said mask to provide individual integrated circuit devices.

The present invention relates to integrated circuits of the kind in which the components thereof are electrically isolated from one another, and more particularly to an improved method for fabricating integrated circuits in which the components are isolated from one another by a dielectric composition of matter.

Although the desirability and practicability of integrated circuits are well recognized, the problems of providing requisite isolation between separate circuit components in a single, physical unit and desired electrical connections between individual portions thereof pose serious obstacles to the attainment of the truly generic approach thereto. While various electronic circuits are relatively well suited for incorporation in a single, solid-state unit, processing is inapplicable to produce solid-state circuits therefrom.

The present invention provides a method for fabricating a group of single, solid-state units, each having a plurality of electronic components in accordance with known transistor manufacturing procedures, followed by the establishment of requisite electrical connections to such electronic components, and between individual portions thereof as required for attainment of a desired circuit configuration. This is accomplished with the circuit components relatively unisolated in the crystal wafer. The invention then provides for the establishment of electrical isolation (or insulation) between the circuit components without disturbing the components themselves or the electrical connections therebetween. It is possible to carry out the process of the present invention with conventional semiconductor processing equipment and without modification of recognized processing techniques, so that the process hereof is admirably suited for utilization with existing manufacturing facilities. There is provided herein, however, the material advantage of being able to separate, for example, by scribing and breaking, the individual integrated circuit devices.

It is therefore an object of the invention to provide an improved integrated circuit device; it is a further object to provide an integrated circuit in which at least some of the components of the circuit are isolated from one another by an isolation medium. It is another object of the invention to provide a method for separating integrated circuits fabricated on the same wafer.

The invention, in brief, comprises the fabrication of a group of integrated circuits in a monolithic semiconductor slice, the selective etching from the backside of the slice to form an air gap between the components of the circuit to be isolated, the placing of a mask on the backside, backfilling the air gap with an isolation medium, for example, a sodium silicate composition, removing the mask, and then separating the units beneath the removed mask. One embodiment of the invention comprises the separating of the wafer into individual devices without removing the mask.

The novel features believed to be characteristic of the invention are set forth in the appended claims. The invention itself, however, as well as further objects and advantages thereof, will best be understood from the following detailed description of illustrative embodiments, when read in conjunction with the accompanying drawing wherein:

Figure 1:
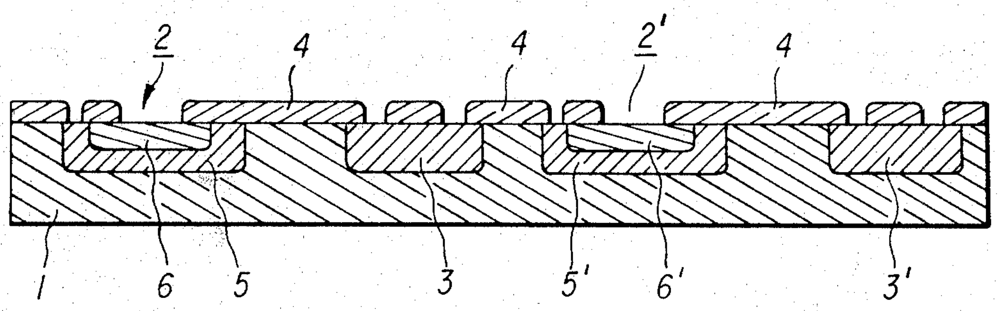
FIGURE 1 illustrates a sectional view of a semiconductor wafer having a semiconductor region diffused therein.

Considering first the process and referring to FIGURE 1 of the drawings, the manufacture of the improved integrated circuit includes the initial preparation of a wafer of monocrystalline semiconducting material of requisite polarity, in accordance with established procedures. Although a substantial number of circuit complexes may be formed from a single wafer of semiconducting material, the following description appertains only to a pair of complexes in the interests of simplicity. The individual semiconducting devices forming the components of the circuit complexes hereof may be formed, for example, by diffusion of selected impurities into the wafer and through suitable and known control of these diffusion steps it is possible to produce in a single wafer a large plurality of semiconducting devices such as diodes and transistors. The foregoing may follow conventional manufacturing techniques, wherein it is normal to produce a large number of semiconducting devices in a single wafer, and later to separate these into individual circuit components. FIGURE 1 illustrates a pair of circuits in an early stage in the manufacture of the integrated circuit of this invention, wherein a wafer 1 is shown with transistors 2 and 2' and resistors 3 and 3' formed therein. The transistors 2 and 2' may be formed by the controlled diffusion of a selected impurity into the front face of the wafer to form base layers 5 and 5', and the subsequent limited diffusion of an impurity of opposite polarity into these base layers to form emitter layers 6 and 6'. The wafer itself has a suitable impurity disposed therethrough to impart the desired polarity to the material so that there is provided in the transistors 2 and 2' a pair of rectifying junctions disposed in conventional manner between the separate portions of the transistors. Similarly, the resistors 3 and 3' may be formed by the diffusion of an impurity into the wafer. Subsequent to the diffusion of selected impurities into the wafer there are formed openings through the protective coating 4 for example, silicon oxide, atop the wafer for communication with separate portions of the transistors and resistors in order to afford communication thereto for electrical connections. These openings, as shown in FIGURE 1, may be produced by suitable controlled etching operations.

Figure 2:
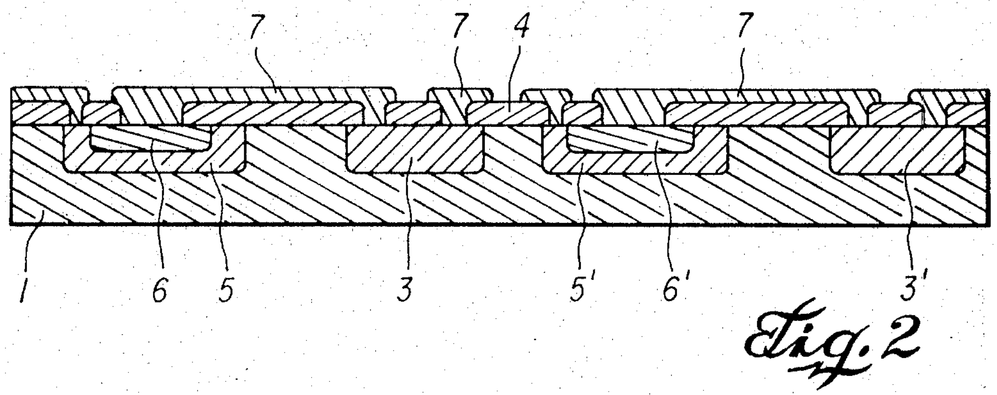
FIGURE 2 illustrates the wafer of FIGURE 1 having metal contacts formed to said diffused regions.

Attachment of electrical connections to the circuit elements of the solid-state unit is preferably accomplished by the plating of a suitable metal upon the upper surface of the unit, such that this metal then extends through the openings in the coating 4 about the wafer. There will thus be seen in FIGURE 2 to be formed in the above manner electrical connections 7 extending over the surface of the protective coating 4 and through the openings therein into electrical ohmic contact with selected regions of the transistors 2 and 2' and resistors 3 and 3' diffused into the wafer. In this respect, it is particularly to be noted that the coating 4 must have a high electrical resistance in order to properly isolate the electrical leads 7 from the remaining portions of the circuit. All of the steps of the process described up to this point may be performed without moving the wafer from which the semiconducting solid-state circuit is to be formed.

Figure 3:
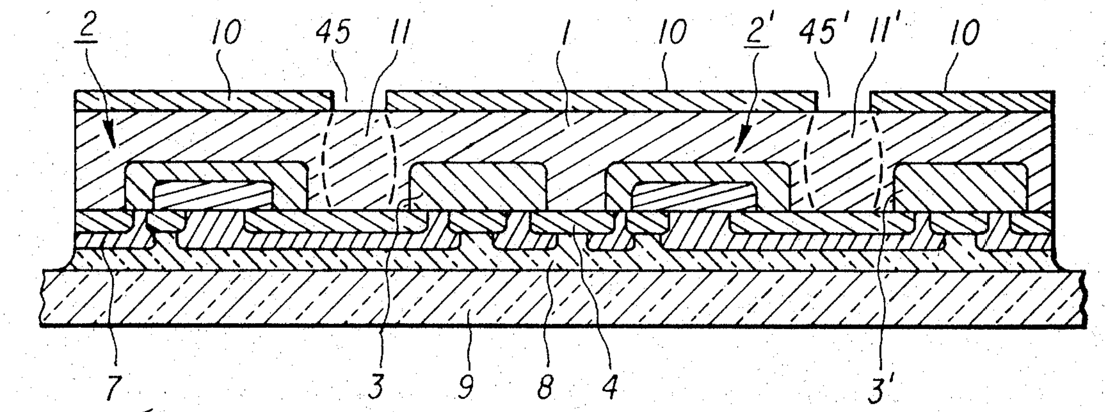
FIGURE 3 illustrates a sectional view of the wafer of FIGURE 2 invertedly mounted on a hold-down substrate.

Following the application of the electrical connections over the upper surface of the wafer and into electrical contact with selected portions of the transistors and resistors formed therein, the wafer is inverted and mounted face down to a ceramic or glass base 9, using a hold-down plastic medium 8 as illustrated in FIGURE 3. This inversion leaves a back face of the wafer exposed. There is then formed on said back face a protective coating 10, for example, silicon oxide. This back face is then selectively operated upon in a conventional manner, such as by etching, to form openings 45 and 45' through the protective coating 10 on the wafer. The openings are oriented to lie in line with the space between the devices 2 and 3 and between 2' and 3' formed in the wafer. Through these openings there is applied a selective etchant, such as CP8, described in "Transistor Technology," vol. 2, edited by F. J. Biondi, at page 598, which operates to relatively rapidly etch through the wafer from the back side thereof to the front. In this respect, it is noted that any of the class of etchants which are rich in nitric acid are selective CP8 being formed of five parts of concentrated nitric acid and three parts of concentrated hydrofluoric acid. With regard to the selectivity of the etching operation, it is contemplated in accordance herewith that there shall be etched out a moat or channel extending through the wafer from the back thereof to the front, but not through the protective coating 4 upon the front of the wafer. In accordance herewith, the protective coating 4 upon the front face of the wafer whereat the transistors and resistors are diffused is maintained intact throughout most of the process hereof. Likewise, the electrical connections 7 plated upon this front face of the wafer over the protective coating 4 and into electrical connection with different regions within the wafer, are maintained intact inasmuch as the etching operation does not extend beyond the front face of the wafer from the back thereof. The etchant is applied to the back of the wafer which is uppermost following the above-noted inversion of same, and there is consequently etched away the channels 11'' and 11''' indicated by the dashed line regions 11 and 11' extending through the wafer from the back thereof to the under side of the protective coating upon the front face of the wafer. It will be appreciated that following this etching step the wafer is divided into three separate parts, insofar as the semiconducting material is concerned, but the wafer can easily be handled because the separated parts are mounted down on the ceramic base 9, using the hold-down plastic medium 8.

Figures 4, 5, 6:
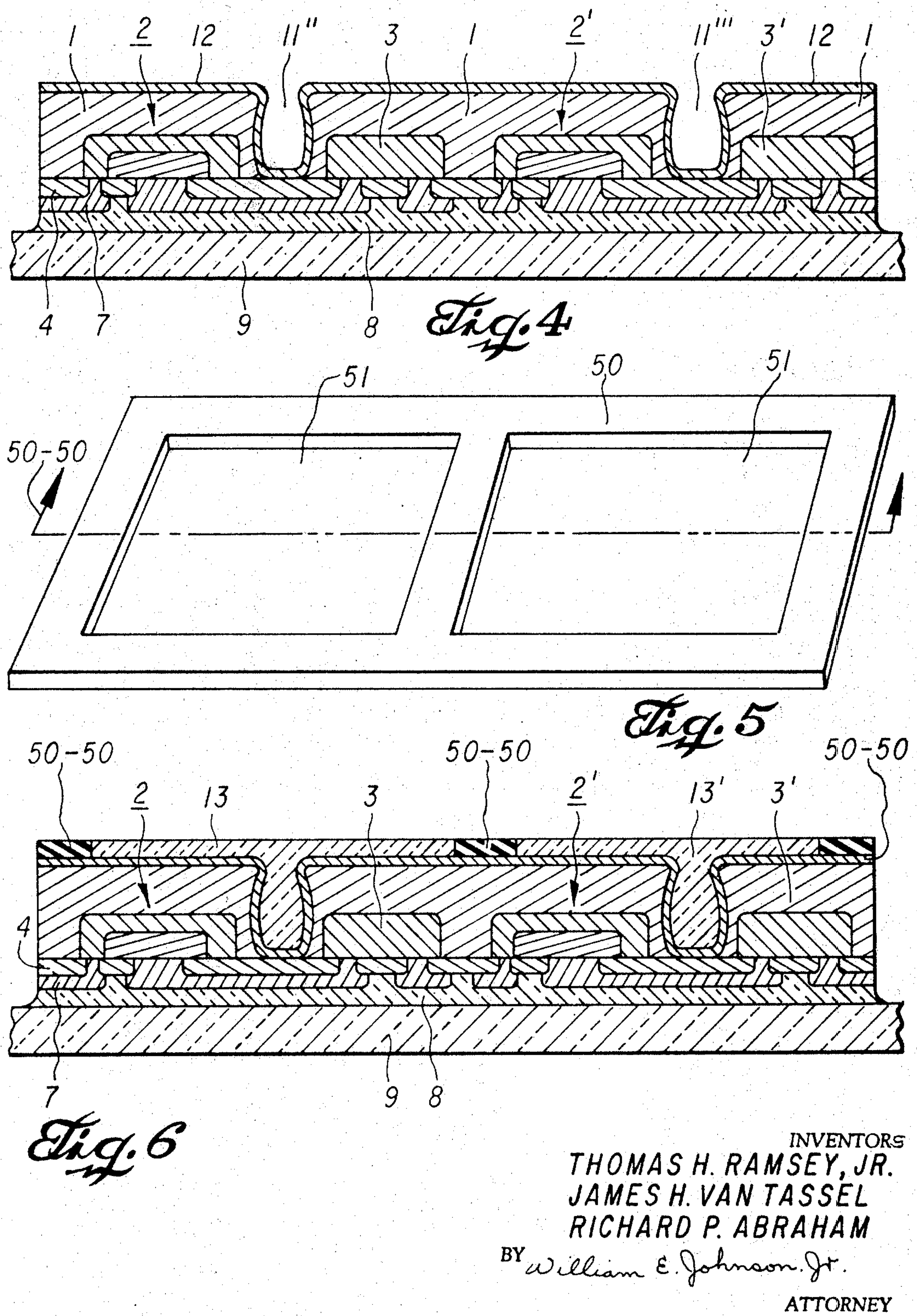
FIGURE 4 illustrates a sectional view of the wafer of FIGURE 3 having portions of the semiconductor removed between some of the diffused regions.
FIGURE 5 illustrates a pictorial view of a mask for utilization on that side of the wafer in FIGURE 4 having portions of the semiconductor removed.
FIGURE 6 illustrates a sectional view of the mask of FIGURE 5 placed on the wafer of FIGURE 4 and a dielectric material replacing said removed portions.

Following the above-described etching of the moats 11'' and 11''' through the wafer, a thin glass film 12, approximately 2100 A. thick, is applied to the back side of the wafer, as illustrated in FIGURE 4. The film is preferably a borosilicate glaze, an can be applied in a conventional evaporation manner to provide a buffer zone between the semiconductor wafer 1 and the subsequently applied insulating material 13.

There is a current trend to consider sodium (Na) as a major factor in degradation of semiconductor devices, and because of this trend the glass film 12 can be used as a buffer zone, if desired, to prevent migration of the sodium into the semiconductor material.

FIGURE 5 illustrates a mask 50, for example, a Mylar tape such as is available from E. I. du Pont de Nemours and Company, Mylar being a transparent, water-repellent film of polyethylene terephthalate resin. The mask 50 has holes 51 therein which are patterned to act as a form placed on the wafer as illustrated in FIGURE 6, wherein the mask 50 is shown along the section line 50—50. The Mylar tape used has an adhesive side and is caused to be adhered to the wafer. The mask 50 is used so that the subsequently applied insulating material 13 does not cover the region of the wafer between resistor 3 and transistor 2', because, as will be illustrated hereinafter, the wafer will be scribed and broken to separate the wafer in that protected region and the mask eliminates the problem of having to break through the insulation material 13. This insulating material 13, preferably in a liquid form, is applied over the buffer zone 12 to fill the moats 11'' and 11'''. This insulating material serves a plurality of purposes and may, for example, comprise a sodium silicate ($Na_2O \cdot SiO_2$). Since sodium silicates are found to vary considerably between commercial vendors, care should be given to the selection of the material. One such sodium silicate which has been found to be particularly effective is Number 31, available from Sauereisen Cements Company in Pittsburgh, Pennsylvania. A preparation of $Al_2O_3$ and $SiO_2$ (in quartz form) is mixed, wherein the ratio is about 1 part $Al_2O_3$ and 3 parts $SiO_2$. The $Al_2O_3$ is itself a one to one (1:1) mixture of large mesh (—100) and small mesh (—325), the small mesh being used with the large mesh to reduce the porosity of the mixture. The final insulating medium 13, in the preferred embodiment, comprises about 25% of the sodium silicate and about 75% of the $Al_2O_3$—$SiO_2$ mixture. With the filling of the moats 11'' and 11''' with a material such as above described, there is provided a substantial electrical insulation, or isolation, between the separate portions of the wafer 1 and, in particular, between the transistor 2 and resistor 3 and between transistor 2' and resistor 3' formed therein. Furthermore, the insulating material used for the back fill and identified by the numeral 13 serves to rigidly bond together the various portions of the wafer by refilling the moats 11'' and 11'''. With the hardening of the liquid 13, poured into the moats, it will be appreciated that the wafer is again joined together into a single integral unit. Not only are the separate portions of the two circuits electrically isolated by the interposed insulation but, furthermore, the structural rigidity of the wafer is restored. It is to be appreciated that the insulating material 13 has substantially the same coefficient of expansion as the semiconductor.

After the insulating material 13 is hardened, the mask 50 and hold-down material 8 are removed from the wafer by a suitable etch solution, for example, the well-known phenol-base solvents, or benzol ether, or trichloroethylene. Another solvent, J–100, a blend of organic solvents and organic activators commercially available from Indust-Ri-Chem-Laboratory in Richardson, Texas, has been found to remove enough of the mask to permit the rest of the mask to be pulled off. Masks other than of Mylar also have produced successful results, for example, acetate tapes and paper tapes, both of which can be removed with trichloroethylene.

It should be appreciated that the mask 50 may be of a material other than tape, for example, a photoresist or a deposited or grown semiconductor. Such a mask can be left on prior to and during the physical separation of the devices, there being no necessity for removing a mask which can be separated easily.

Figure 7:
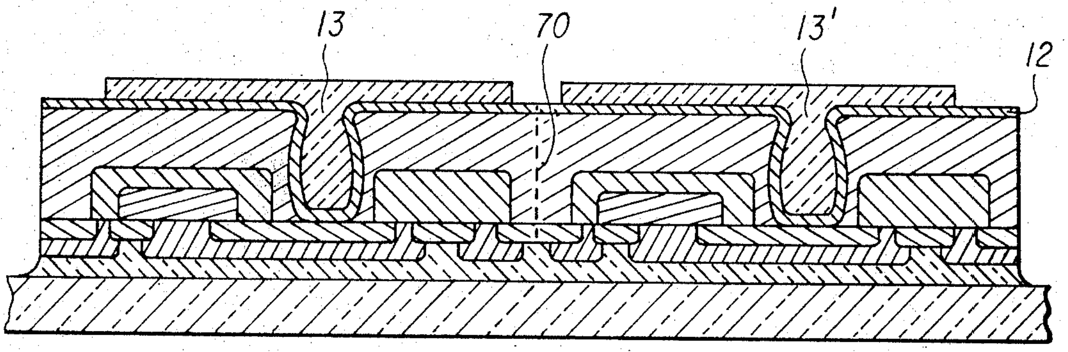
FIGURE 7 illustrates a sectional view of the wafer of FIGURE 6 having the mask and hold-down substrate removed.
Figure 8:
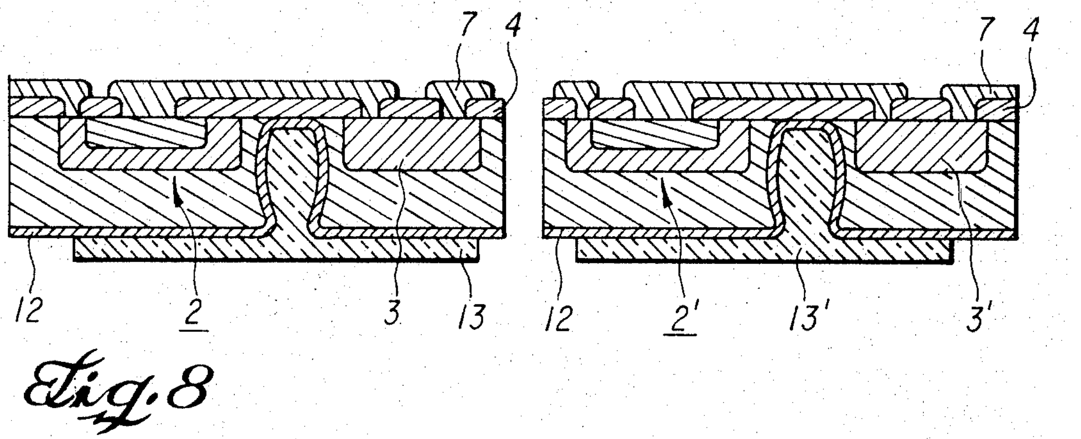
FIGURE 8 illustrates a sectional view of the wafer of FIGURE 7 separated into two segments.

As illustrated in FIGURES 7 and 8, the wafer is separated into two segments along the dotted line 70, for example, by conventional scribing and breaking techniques, resulting in two integrated circuit devices, each of which has dielectric insulation material (respectively 13 and 13') between components and each of which is mechanically stable.

Following the foregoing steps, the unit is further processed in accordance with conventional manufacturing steps, and suitable encapsulation is performed.

There has been described above the preferred and improved steps of the process of this invention, wherein there is formed a solid-state circuit from semiconducting material to produce a maximized insulation between separate components of the circuit while yet attaining a truly unitary solid-state device formed of a number of components. Although the process has been described in simplified form as related to a small wafer it will be appreciated that the process is equally applicable to more complicated configuration wherein a larger number of semiconducting devices and circuit elements are to be isolated within a single unit. By the utilization of selective etching, suitably controlled and applied from the back side of the wafer, it will be seen that the unit is at all times maintained in one single piece, and under no circumstances are the separate electronic components thereof physically separated. This is highly advantageous in that very serious difficulties arise from efforts to recombine separate solid-state devices into a single unit. The problems of applying electrical connections to the unit in extension between portions of separate devices therein are minimized. Thus, the application of the electrical leads 7 is materially simplified, inasmuch as the same are applied immediately following the formation of the separate transistors or diodes within the unit. It is not necessary to employ a multiplicity of operations wherein the unit or wafer is moved from a single spot, thereby precluding prior art difficulties of alignment or registration arising from attempts to place the wafer or unit back into exact original positions for performing further operations thereon. Inasmuch as the physical dimensions of the individual components of the solid-state circuit hereof are extremely minute, as of the order of some few mils or thousandths of inches, it will be appreciated that the application of electrical connections to same becomes extremely difficult unless exact registration between manufacturing apparatus and the unit or wafer itself is maintained.

Figures 9, 10:
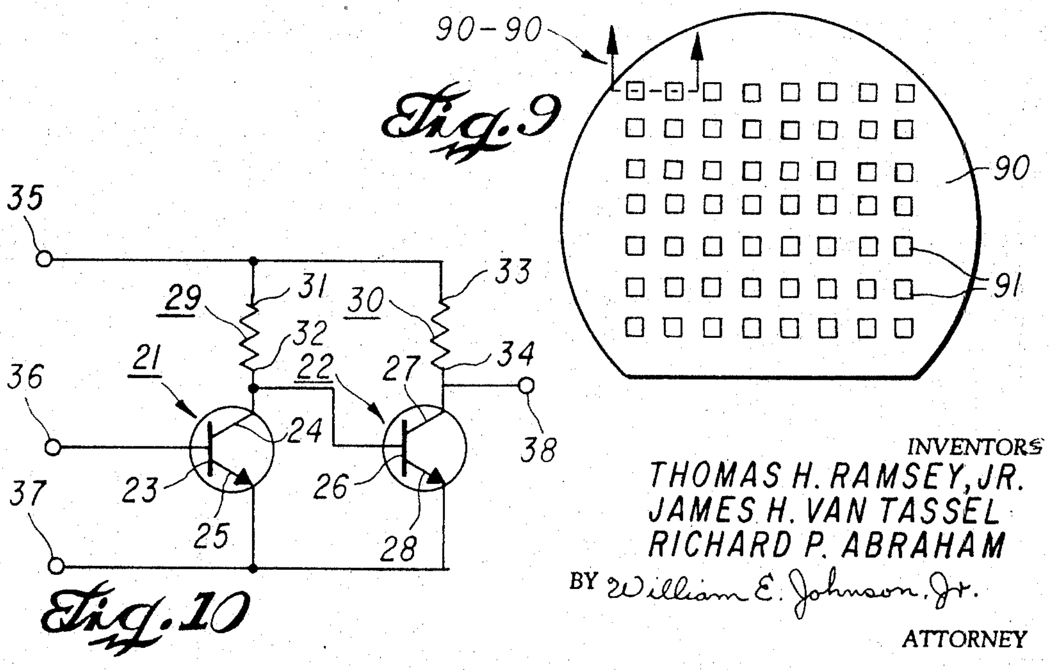
FIGURE 9 illustrates a plan view of a wafer of semiconductor material having a plurality of integrated circuits formed therein.
FIGURE 10 illustrates a schematic view of one of the integrated circuits of FIGURE 9.

FIGURE 9 illustrates a semiconductor wafer 90, having a plurality of individual integrated circuits 91 therein, each of said circuits being like that illustrated in FIGURE 10 for purposes of facilitating illustration. The illustration of a pair of such circuits in FIGURE 11, taken along the section line 90—90 of FIGURE 9, shows a typical circuit capable of being fabricated as an integrated circuit. Since the two circuits are identical except for the one circuit having a prime attached to its respective number (example, emitter region 25 has a counter part 25'), only one of the circuits will be described in detail.

Figure 11:
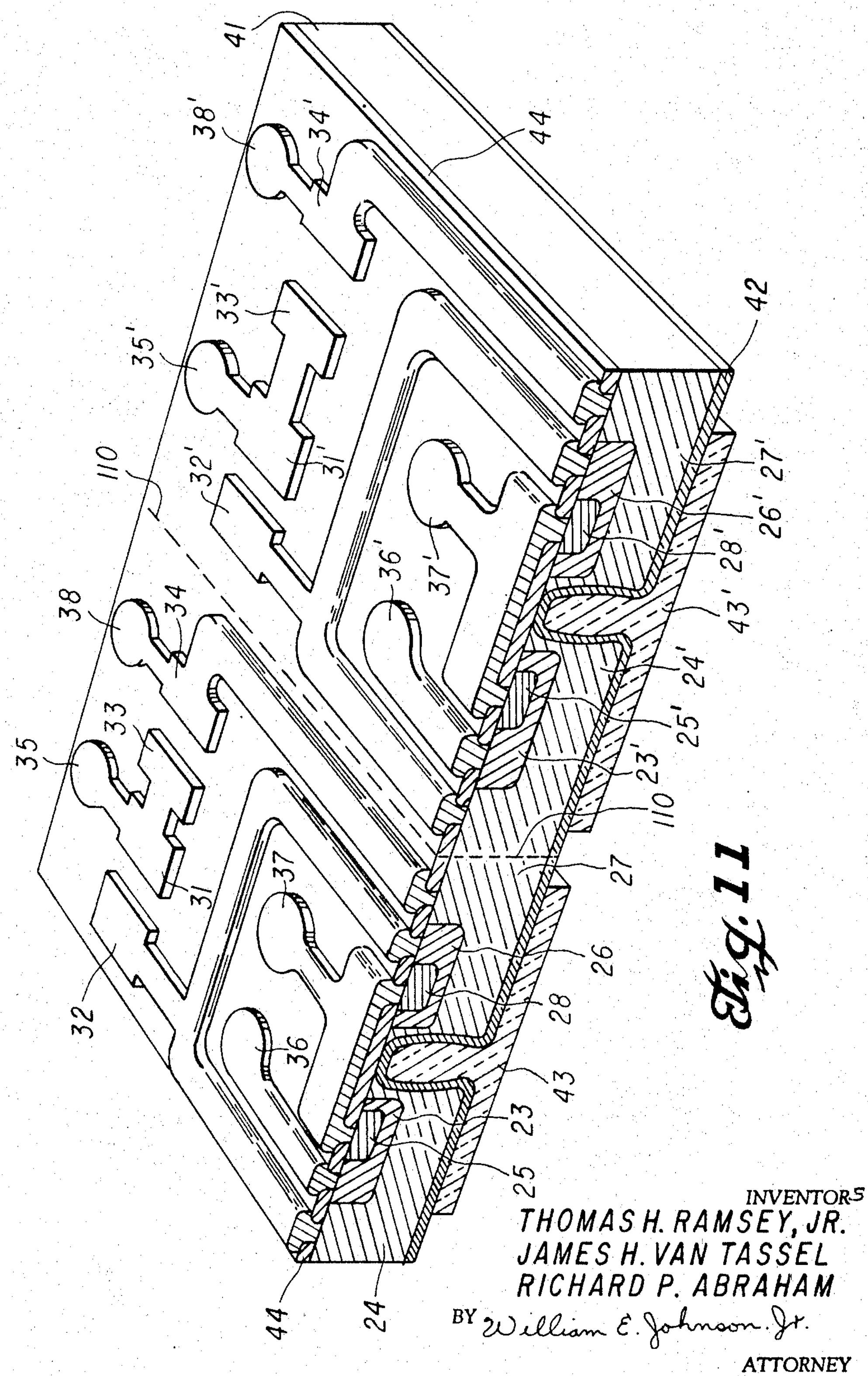
FIGURE 11 illustrates a partially-sectioned pictorial view of two of the integrated circuits of FIGURE 9 taken along a sectional line 90—90.

It will be seen from the illustration of FIGURE 11 (which embodies the circuit of FIGURE 10 and like numbers denote like components) that the pair of transistors in the wafer 41 are completely isolated from each other by the barrier of insulating material 43 with the sole interconnection of transistor elements being provided by electrical leads, as identified above, extending across the insulating coating upon the upper surface of the solid-state unit. Likewise, the resistors 29 and 30 of the circuit of FIGURE 10 are included as an integral part of the single physical unit, but are not visible in FIGURE 11 because of being beneath the surface of the device.

The integrated circuits of FIGURE 11 are fabricated using a mask (similar to FIGURE 5) to control the geometry of the insulating material 43 and 43', but is not illustrated. The wafer is physically separated along the dotted line 110, for example, by scribing and breaking, to result in a pair of integrated circuit devices. It should be appreciated that the devices and circuits are fabricated similarly to those of FIGURES 1–8, inclusive, and that there is a collector region 24, an emitter region 25 and a base region 23 in the one transistor, the top of the wafer is partially covered by an oxide layer 44, and that the regions extending through the oxide layer are metal contact regions leading to bonding pads 35, 36, 37 and 38. The other transistor has a collector region 27, a base region 26 and an emitter region 28.

Although only one edge of the moat filled with insulating matterial is illustrated in FIGURE 11, for simplicity, it is understood of course that a moat would extend completely around or encircle each of the components. That is, the transistor 21 would have a moat extending all the way around it and isolating it from the transistor 22 and from the resistors 29 and 30. Each of the resistors would as well have a moat around them isolating them from one another and from the transistors 21 and 22. The moats filled with insulating material do not intersect the scribe lines 110 since this would make scribing and breaking more difficult.

This same feature appears in each of the FIGURES 3, 4 and 6–8 where only one edge of one moat is illustrated, for simplicity, although it is understood that a true sectional view would show four more moats 11 in FIGURE 4, for example, rather than only two. A moat just like 11'' or 11''' would appear on each side of each component. This is to insure that a moat exists isolating each component from the others and that no moats intersect the scribe lines 70.

It would be understood that while the components of the integrated circuits shown above are shown to be formed by diffusions, these circuit elements could as well be formed by selective epitaxial growth, or could include elements on top of the oxide such as deposited metal film resistors or metal-oxide-semiconductor field effect transistors.

The unitary integrated circuit of the present invention will be seen to comprise a single integral element embodying semiconducting material of desired properties in particular relationships, together with a bonded insulating material which affords the necessary electrical insulation between elements, as well as a highly desirable structural strength and rigidity to the resultant unit. The present invention provides a highly practical manner of producing an integrated circuit having the attributes sought after in the art. Accordingly, the difficulties of multiple handling, as well as registry of minute elements with manufacturing equipment, is minimized, so as to thereby attain extreme accuracy at a reduced cost. This results not only in a improved result, but also in a minimization of the failures during processing, so as to thereby even further commend the process hereof to commercial manufacture.

While the circuit device of FIGURE 11 has been illustrated as embodying the invention, such a circuit (as in FIGURE 10) forms no part of the invention and is in no sense to be construed as a limiting factor but is merely shown and described to illustrate one of a large number of circuits which could be embodied in an integrated circuit device fabricated according to the invention. Although the invention has been described in a simplified form with respect to a small wafer that involves only the isolation of a few elements, it will be appreciated that the invention is equally applicable to more complicated configurations wherein a larger number of elements are to be isolated within a unit.

What is claimed is:

1. A method of fabricating integrated circuit devices comprising:

(a) providing a plurality of groups of circuit elements at one face of a wafer of semiconductor material, said circuit elements including regions of said semiconductor material, each group providing one of a plurality of individual integrated circuits with the groups being spaced from one another along the wafer;

(b) selectively removing semiconductor material from the opposite face of the wafer between said circuit elements to define openings in said wafer which electrically isolate the circuit elements from one another within the group;

(c) applying a mask to said opposite face to cover portions of said opposite face in the areas between said groups, while exposing through apertures in said masks portions of said opposite face including the areas defined by said openings;

(d) substantially filling only the areas of said opposite face of the wafer exposed through the apertures in said mask with a dielectric material;

(e) physically separating the wafer along the areas covered by the mask to provide separated portions of the wafer each respectively containing at least one of the individual integrated circuits.

2. A method for fabricating integrated circuit devices comprising:

(a) providing a plurality of groups of separate regions of semiconductor material on one face of a wafer of semiconductor material, each group providing a plurality of circuit elements;

(b) forming within each group metal interconnections on said one face between said regions, to thereby interconnect the regions as a group of circuit elements so that a plurality of integrated circuits are provided in said wafer;

(c) mounting said first face of the wafer to a holddown substrate;

(d) selectively etching through a second face of said wafer to remove portions of the wafer between said separate regions to electrically isolate circuit elements within each of said integrated circuits;

(e) applying a mask having apertures therein to said second face to cover those areas of said second face between said integrated circuits and to expose through said apertures those areas between said separate regions removed by etching;

(f) filling said etched-out regions exposed through said apertures with a dielectric material;

(g) removing said mask; and (h) separating said wafer at those areas which were covered by said mask, to thereby provide integrated circuit devices.

3. In a method for fabricating integrated circuit devices, the steps of applying a mask to a second surface of a semiconductor wafer having a plurality of integrated circuits on a first surface of said wafer, said integrated circuits being isolated from each other by openings through said wafer between components of said circuits prior to the application of said mask, said mask covering those areas of said second surface between said integrated circuits and exposing said openings, filling said exposed openings with a dielectric material, and physically separating said wafer at the areas covered by said mask, to provide separated portions of the wafer each containing at least one of the integrated circuit devices.

4. The mehod according to claim 2 wherein said mask comprises polyethylene terephthalate tape.

5. The method according to claim 4 wherein said mask is removed by etching.

6. The method according to claim 5 wherein said separating of the wafer along areas covered by the mask comprises scribing and breaking said wafer into individual integrated circuit devices.

7. The method according to claim 1 wherein said dielectric material comprises a sodium silicate composition.

References Cited

UNITED STATES PATENTS

| | | | |
|---|---|---|---|
| 3,152,939 | 10/1964 | Borneman et al. | 156—17 X |
| 3,210,225 | 10/1965 | Brixey | 156—17 X |
| 3,265,542 | 8/1966 | Hirshon | 29—578 |
| 3,343,255 | 9/1967 | Donovan | 29—577 |
| 3,349,481 | 10/1967 | Karp | 29—577 |

OTHER REFERENCES

Industrial Chemistry by Emil Raymond Reigel, Ph. D. 1942 edition (pages 79–80).

Electrical insulating Materials by H. Warren, 1931 edition (pages 122–125).

CHARLIE T. MOON, *Primary Examiner.*

R. B. LAZARUS, *Assistant Examiner.*

U.S. Cl. X.R.

29—578; 580